(12) United States Patent
Rozen et al.

(10) Patent No.: US 7,227,366 B2
(45) Date of Patent: Jun. 5, 2007

(54) DEVICE AND A METHOD FOR BIASING A TRANSISTOR THAT IS CONNECTED TO A POWER CONVERTER

(75) Inventors: Anton Rozen, Gedera (IL); Dan Kuzmin, Givat Shmuel (IL); Michael Priel, Hertzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 87 days.

(21) Appl. No.: 10/955,219

(22) Filed: Sep. 30, 2004

(65) Prior Publication Data

US 2006/0066316 A1  Mar. 30, 2006

(51) Int. Cl.
*G01R 35/00* (2006.01)
*H03K 3/01* (2006.01)

(52) U.S. Cl. ...................... 324/601; 327/534
(58) Field of Classification Search ............... 324/601; 327/534

See application file for complete search history.

(56) References Cited

U.S. PATENT DOCUMENTS

| 6,448,840 B2* | 9/2002 | Kao et al. .................. 327/534 |
| 6,753,719 B2* | 6/2004 | Bhagavatheeswaran et al. .................. 327/534 |
| 2002/0005750 A1 | 1/2002 | Kao |
| 2004/0113649 A1* | 6/2004 | Berthold et al. ............ 324/765 |

* cited by examiner

*Primary Examiner*—Andrew H. Hirshfeld
*Assistant Examiner*—Jeff Natalini

(57) ABSTRACT

Biasing a transistor connected to a voltage converter, the method includes: (i) providing at least one bias voltage to at least one well of at least one transistor of a test circuitry; (ii) measuring at least one parameter of a test circuitry representative of at least one characteristic of the transistor and of at least one characteristic of the voltage converter; (iii) altering at least one bias voltage and repeating the stages of providing and measuring until a predefined control criteria is fulfilled; and (iv) providing a voltage bias to a well of the transistor in response to the measurements.

17 Claims, 4 Drawing Sheets

DEVICE AND A METHOD FOR BIASING A TRANSISTOR THAT IS CONNECTED TO A POWER CONVERTER

FIELD OF THE INVENTION

The present invention relates to a device and to a method for biasing a transistor connected to a voltage converter and especially for biasing the transistor such as to reduce leakage current.

BACKGROUND OF THE INVENTION

Mobile devices, such as but not limited to personal data appliances, cellular phones, radios, pagers, lap top computers, and the like are required to operate for relatively long periods before being recharged. These mobile devices usually include one or more processors as well as multiple memory modules and other peripheral devices.

In order to reduce the power consumption of mobile devices various power consumption control techniques were suggested. A first technique includes reducing the clock frequency of the mobile device. A second technique is known as dynamic voltage scaling (DVS) or alternatively is known as dynamic voltage and frequency scaling (DVFS) and includes altering the voltage that is supplied to a processor as well as altering the frequency of a clock signal that is provided to the processor in response to the computational load demands (also referred to as throughput) of the processor. Higher voltage levels are associated with higher operating frequencies and higher computational load but are also associated with higher energy consumption.

The power consumption of a transistor-based device is highly influenced by leakage currents that flow through the transistor. The leakage current is responsive to various parameters including the threshold voltage (Vt) of the transistor, the temperature of the transistor, and the like. Transistors that have higher Vt are relatively slower but have lower leakage currents while transistors that have lower Vt are relatively faster but have higher leakage current.

U.S. patent application 20020005750 of Kao et al., titled "Adaptive body biasing circuit and method" describes a method for adapting the speed of a certain transistor to a required operational frequency, by biasing the body (or well) of a transistor and as a result altering the threshold voltage Vt of the transistor. The delay of a matched circuit is compared to a required delay and as a result compensating bias voltages are provided to transistors within a compensating circuit. The patent application describes a test circuit that operates at the operational frequency of the transistor.

There is a need to provide a method for reducing leakage current of transistors.

SUMMARY OF THE PRESENT INVENTION

A method for reducing the power consumption of a transistor based device by providing an optimal bias voltage to the well of one or more transistors that are connected to a voltage converter. The optimal bias voltage is determined by repetitively measuring one or more parameters of a test circuitry that is provided with a different bias voltage during each measurement sequence.

The optimal bias voltage can be supplied when the transistor, or usually a circuitry such as a processor that includes the transistor, is operating at a certain operational mode, such as but not limited to an idle mode.

A method for biasing a transistor connected to a voltage converter, the method includes: (i) providing at least one bias voltage to at least one well of at least one transistor of a test circuitry; (ii) measuring at least one parameter of the test circuitry, whereas the at least one measured parameter represents at least one characteristic of the transistor and of at least one characteristic of the voltage converter; (iii) altering at least one bias voltage and repeating the stages of providing and measuring until a predefined control criteria is fulfilled; and (iv) providing a voltage bias to a well of the transistor in response to the measurements.

A device including: (i) at least one transistor; (ii) at least one voltage converter, connected to at least one well of at least one transistor, the at least one voltage converter is adapted to provide at least one bias voltage; and (iii) a test circuitry, connected to the at least one voltage converter, the test circuitry is adapted to: (a) measure at least one parameter of the test circuitry, the at least one measured parameter is representative of at least one characteristic of the transistor and of at least one characteristic of the voltage converter; (b) alter at least one bias voltage provided to the test circuitry and measure at least one parameter, until a control criterion is fulfilled; and (c) determine, in response to the at least one measured parameter, at least bias voltage to be provided to at least one well of the at least one transistor.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The inventors found out that providing a test circuitry and measuring at least one parameter of the test circuitry is more convenient than trying to measure the characteristics of a compensated circuit that includes the transistor. Connecting any measurement circuitry to the compensated circuit can alter the characteristics of the compensated circuit.

For convenience of explanation it is assumed that a single voltage converter provides multiple bias voltages such as Vnw and Vpw, but this is not necessarily so and these bias voltages can be provided by multiple voltage converters.

Figure 1:
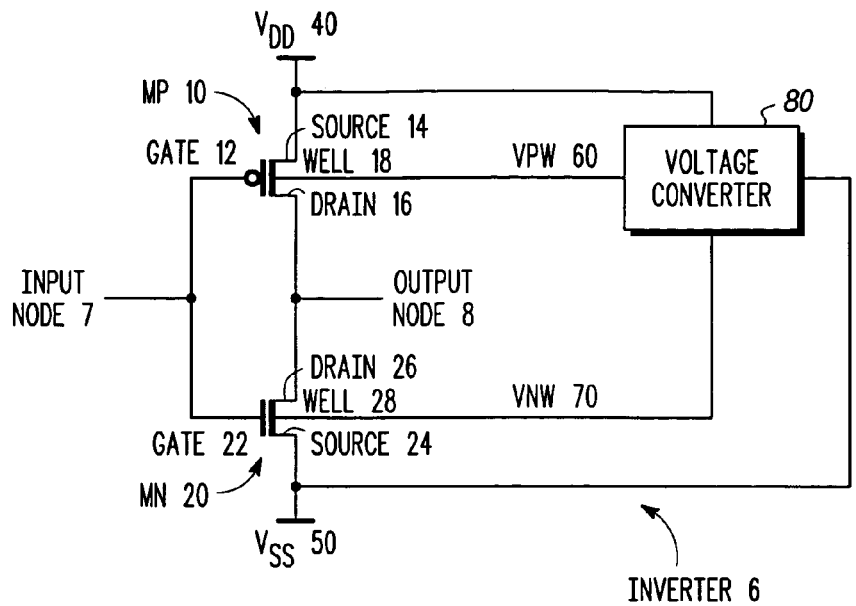
FIG. 1 is a schematic illustration of a pair of transistors that are connected to a voltage converter.

FIG. 1 illustrates an exemplary compensated circuit such as inverter 6. The inverter 6 can be a part of a processor that is positioned within a mobile device, but this is not necessarily so.

Inverter 6 includes an NMOS transistor (Mn) 20, a PMOS transistor (Mp) 10 and a voltage converter 80. Mn 20 has a gate 22, a source 24, a drain 26 and a well 28. Mp 10 has a gate 12, a source 14, a drain 16 and a well 18. Gates 12 and 22 are connected to each other to form an input node 7 of inverter 6 while the drains 16 and 26 of both transistors are connected to form an output node 9 of inverter 6. The source 14 of Mp 10 is connected to a positive power supply (Vdd) 40 while the source 24 of Mn 20 is connected to a negative power supply (Vss) 50. Typically, Vdd and Vss are provided to most of the components of the device that includes the inverter.

It is further noted that such an inverter is mentioned only as an example of a typical basic NMOS circuit, whereas the invention can be applied to other circuits.

In order to reduce the overall leakage current of Mn and Mp, especially when the inverter 6 is idle, both Mn and Mp are reversed well biased. The well 18 of Mp 10 receives a bias voltage Vpw 60 that is more positive than Vdd 40 and the well 28 of Mn 20 receives a bias voltage Vnw 70 that is more negative than Vss 50. These bias voltages (Vpw and Vnw) are provided by a voltage converter 80 that in turn receives as input Vdd 40 and Vss 50.

A typical voltage converter is a charge pump voltage converter, but this is not necessarily so. Other types of converters can be used, including buck converters, boost converters, buck-boost converters, CUK converters, flyback converters, forward converters, and the like.

The aggregate leakage current of the inverter 6 includes a source drain leakage current (ILsd), a substrate leakage current (ILs) and a voltage converter current. The voltage converter current is typically substantially smaller than ILsd and Ils.

ILs is proportional to the bias voltage. ILs is a leakage current that flows through the well of the transistors and is drained from the voltage converter 80. It is an output current of the voltage converter. The input current that is drained by the voltage converter in order to provide such an output current is ILs/Eff, whereas Eff is a ratio between an output current of the voltage converter and an input current of the voltage converter. This ratio is also termed voltage converter efficiency. Typically, Eff=0.3, but this is not necessarily so. It is noted that the efficiency of the voltage converter can be termed as the ratio between the output power and the input power.

ILsd is inversely proportional to the bias voltage (Vpw or Vnw). The inventors found out that the source drain leakage current of NMOS transistors, as well as PMOS transistors is minimal at a certain bias voltage. This certain bias voltage differs in response to various parameters including temperature, manufacturing (process) variants, supply voltage values, and the like. It may also change over time.

Figure 4:
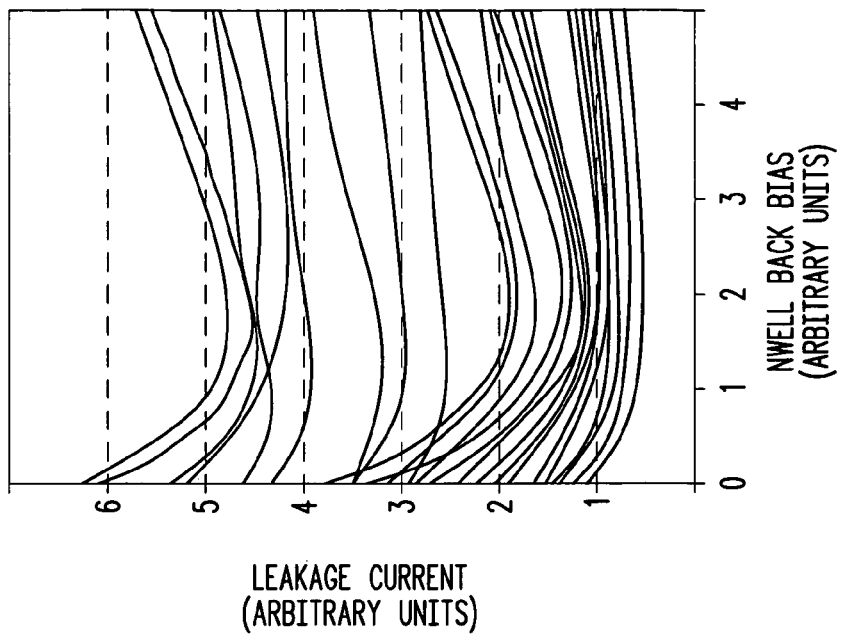
FIG. 4 is a graph illustrating two exemplary relationships between a voltage thresholds and a leakage current of a transistor.
Figure 4:
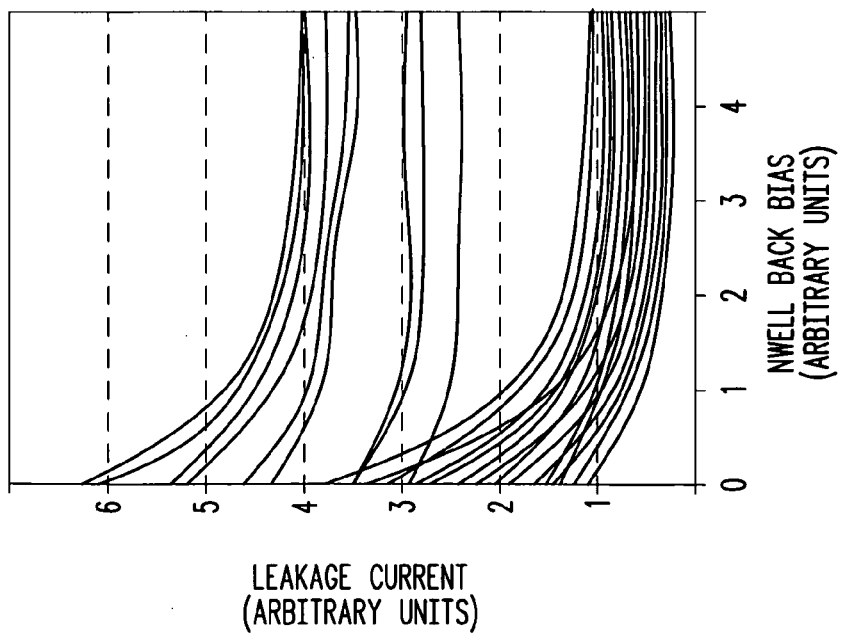

As illustrated by FIG. 4 the relationship between the aggregate leakage current of the inverter and the bias voltage has a single minimum. Thus, in order to locate an optimal bias voltage that minimizes the leakage current there is a need to find this minimum. It is noted that if other relationships exist other minimum (or even local minimum) locating algorithms can be applied.

It is further noted that various minimum locating algorithms can be applied such as but not limited to the Bolzano-Weierstrass method.

Each transistor type (e.g. PMOS and NMOS) is characterized by its own relationship and its own minimum point. Accordingly, the optimal Vpw (that results in a minimal PMOS transistor leakage current) is found independently from the optimal Vnw.

Figure 2:
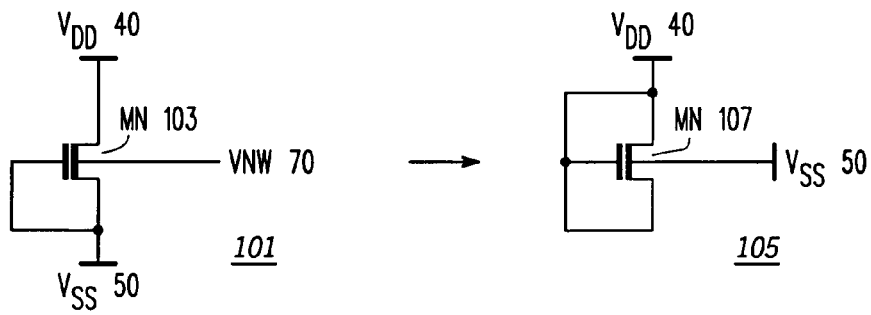
FIG. 2 is a schematic diagram of a test circuit of a first type and a test circuit of a second type according to an embodiment of the invention.

FIG. 2 is a schematic diagram of a test circuit of a first type 101 and a test circuit of a second type 105, according to an embodiment of the invention. For simplicity of explanation only NMOS test circuits are illustrated, whereas equivalent test circuits for PMOS transistors are also utilized. In the PMOS transistors the NMOS transistors of test circuits 101 and 105 are replaced by PMOS transistors.

A parameter, such as the leakage current of test circuit 101, is representative of ILsd. A parameter, such as the leakage current of test circuit 103, is representative of ILs.

Test circuit 101 includes an NMOS transistor 103, having substantially the same characteristics of Mn 20. The source of NMOS transistor 103 is grounded and its gate and source of the NMOS transistor are connected to Vdd 40. Test circuit 105 includes an NMOS transistor 107, having substantially the same characteristics of Mn 20. The source, gate and drain of NMOS transistor 107 are connected to Vdd 40. The wells of NMOS transistors 103 and 107 are connected to a bias voltage source Vb 109.

Figure 3:
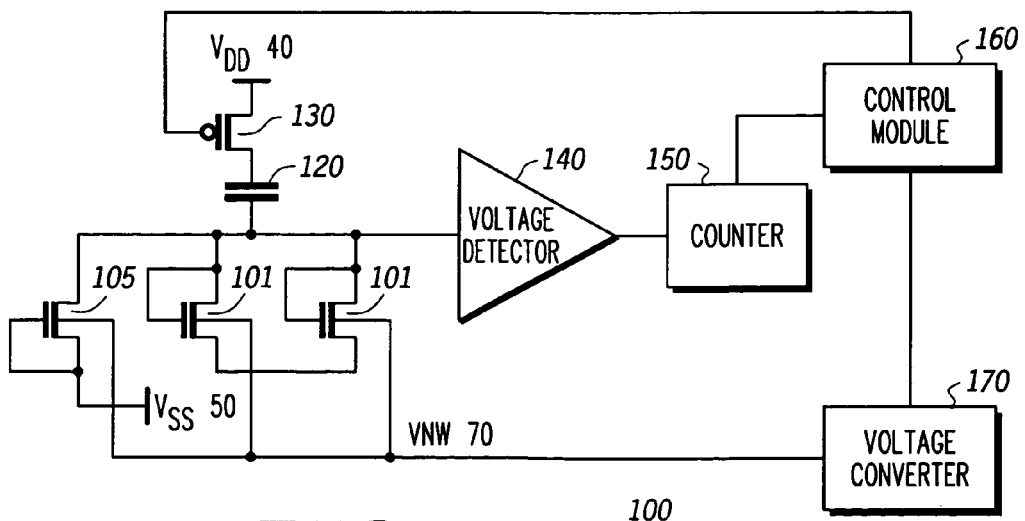
FIG. 3 is a schematic circuitry of a test circuitry according to an embodiment of the invention.

FIG. 3 is a schematic circuitry of a test circuitry 100 according to an embodiment of the invention.

Test circuitry 100 measures a current that is representative of the aggregate leakage current of inventor 6. As previously noted, the aggregate leakage current is responsive to various leakage currents and to the efficiency of the voltage converter connected to the inverter.

The test circuitry includes multiple test circuits. In order to provide an indication about the aggregate leakage current the efficiency of the voltage converter must be taken into account. Thus, the ratio between the amount of test circuits of the first type and test circuit of the second type is responsive to Eff. The inventors used a ratio of 2/(1/Eff−1), but other ratios can be used.

For simplicity of explanation a ratio of 0.5 was assumed, thus test circuitry 100 includes two test circuits of the second type 101 and a single test circuit of the first type 102. It is noted that the test circuitry 100 can include much more test circuits, as long as the ratio between test circuits of the two types remains.

It is also noted that test circuitry 100 includes NMOS transistors and that an equivalent test circuitry, including PMOS transistors, is also provided for PMOS transistors. Each test circuitry is activated in order to locate the corresponding optimal bias voltage. Test circuitry 100 is used to determine the optimal Vnw.

According to an embodiment of the invention the reduction of leakage current is required during idle periods, as the decrement of the leakage current also slows the transistor. It is noted that this is not necessarily that the method can be applied for locating an optimal bias voltage under speed constraints. For example, if the transistor operates at a certain frequency and the bias voltage required for achieving that frequency is known, the method can be applied over a bias voltage region that starts by that certain bias voltage.

According to an embodiment of the invention the method is performed whenever the compensated circuitry such as a processor that includes inverter 6 enters an idle state.

The test circuitry 100 is operated for minimizing leakage current at idle states thus is can operate at a very low frequency. By operating at very low frequencies the power consumption of the test circuitry is relative small and even negligent. The inventors operated the test circuitry at low frequencies of about 64 Khz, while the inverter 6 can operate at much higher frequencies (500 Mhz and above).

Test circuitry 100 provides an indication of the leakage current by connecting multiple test circuits 101 and 105 to a capacitor 120, discharging the capacitor 120 by the leakage current of these test circuits, and providing an indication about the discharging period. The capacitor 120 is connected to a drain of PMOS transistor 130 while the source of that PMOS transistor 130 is connected to Vdd 40. The gate of the PMOS transistor 130 receives a control signal from a control module 160 that turns the PMOS transistor 130 ON to charge the capacitor 120 and turns the PMOS transistor 130 OFF in order to discharge the capacitor 120 by the leakage currents of test circuits 101 and 105.

The sources of the NMOS transistors within the test circuits are connected in parallel to each other and also to a voltage detector 140 that monitors the discharge of capacitor 120 via the test circuits. The voltage detector 140 can compare the input voltage to a reference voltage to define when the capacitor has discharged to a predefined voltage level. The output of the voltage detector 140 is connected to a counter 150 that measures the discharge period of capacitor 120.

The counter 150 provides a timing signal indicative of the discharge period to a control module 160. The control module 160 is also connected to a voltage converter 170 that provides a bias voltage Vb to the transistors of the test circuits 101 and 105. The voltage converter 170 can also provide the bias voltage to the compensated circuit.

The control module 160 determines which bias voltage to provide during each iteration of a test sequence and also may determine when the sequence ends—for example, when an optimal bias voltage is found.

It is noted that test circuitry 100 can be implemented by a relatively simple circuit with a simple control algorithm, as it locates a minimum of a relatively simple curve describing the relationship between current leakage and bias voltage. Furthermore, the test circuitry 100 does not have to store many measurement or to accurately measure the capacitor discharge period, as it can just determine if a current discharge period is larger than or smaller than a previous discharge period and in response either increase or decrease the bias voltage that is provided to the test circuits during a next test iteration.

Figure 5:
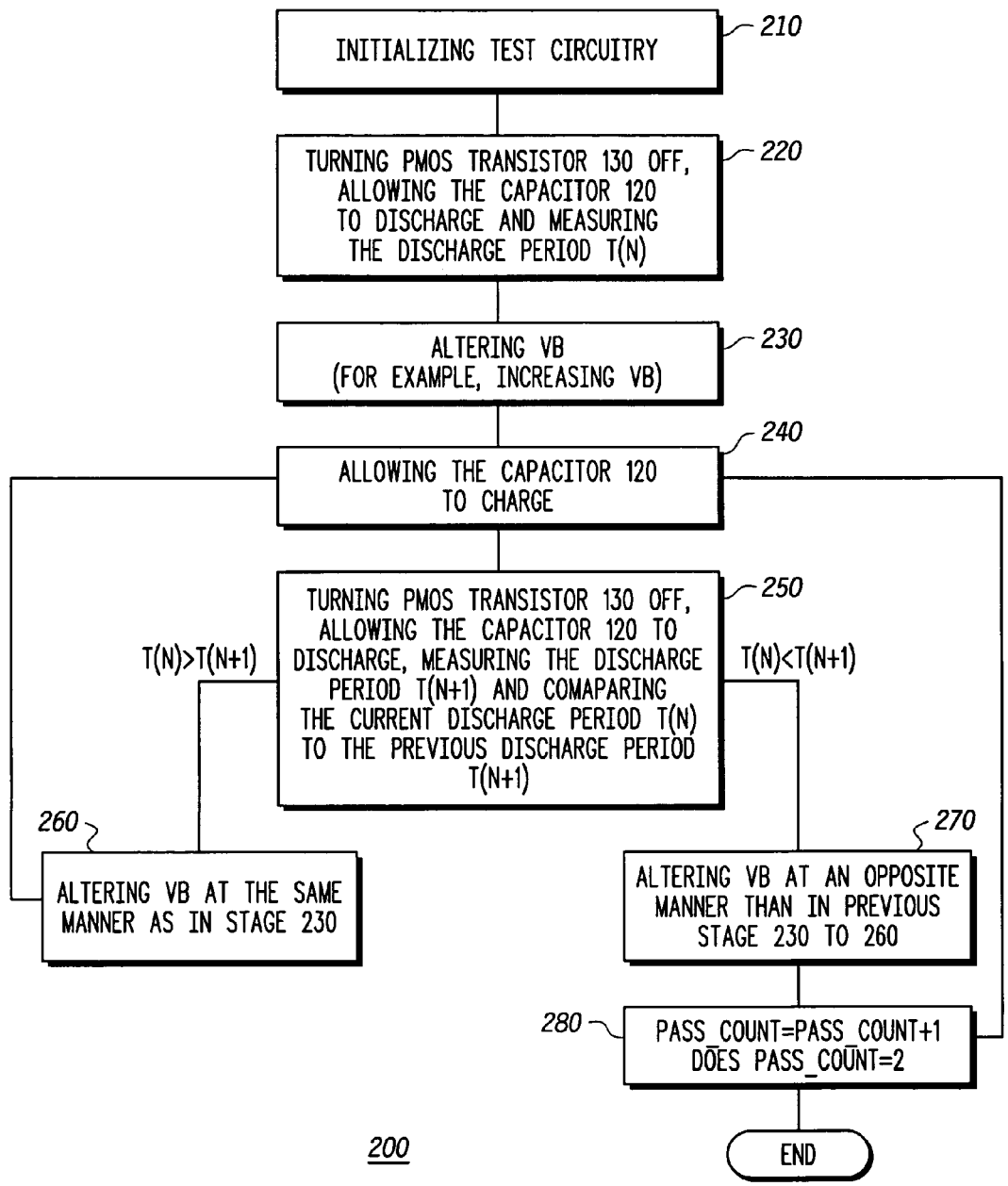
FIG. 5 is illustrates various stages of a test sequence, according to an embodiment of the invention.

FIG. 5 is illustrates various stages of a test sequence 200, according to an embodiment of the invention. Control module 160 controls the execution of the test sequence 200.

Test sequence 200 starts at stage 210 of initializing test circuitry 100. This initialization may includes providing a certain bias voltage Vb to the transistors of the test circuits 101 and 105, resetting the counter 150, resetting a pass counter value, and allowing the capacitor 120 to charge via PMOS transistor 130, to a predefined voltage level, such as substantially Vdd-Vt.

Stage 210 is followed by stage 220 of turning PMOS transistor 130 OFF, allowing the capacitor 120 to discharge and measuring the discharge period T(n). This measurement is sent to the control module 160 and is stored for comparison with the next discharge period.

Stage 220 is followed by stage 230 of altering Vb (for example, increasing Vb) and jumping to stage 240 of allowing the capacitor 120 to charge. Stage 240 is followed by stage 250 of turning PMOS transistor 130 OFF, allowing the capacitor 120 to discharge and measuring the discharge period T(n+1). Stage 250 also includes comparing the current discharge period T(n) to the pervious discharge period T(n+1).

If T(n)>T(n+1) then the leakage current decreased and stage 250 is followed by stage 260 of altering Vb at the same manner as in stage 230 (for example—Vb id also increased). Stage 260 is followed by stage 240.

If T(n)<T (n+1) then the leakage current had increased and there is a need to alter Vb at an opposite manner than during the previous stage 230 or the previous stage 260. For example—if Vb was previously increased it is decreased during stage 270. Stage 270 is followed by stage 280 of increasing a pass counter by one and checking if the pass counter equals two. If it equals two the test ends and the previous provided bias voltage is selected as the optimal bias voltage. Else, stage 270 is followed by stage 240.

Figure 6:
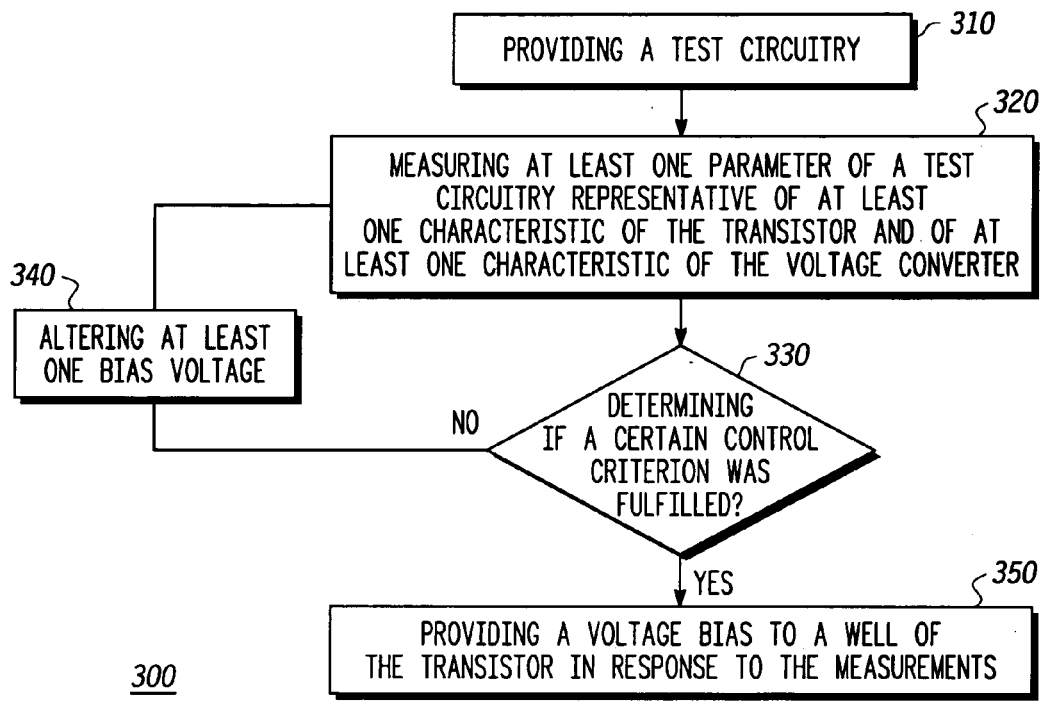
FIG. 6 is a flow chart illustrating a method for biasing a transistor connected to a voltage converter, according to an embodiment of the invention.

FIG. 6 is a flow chart illustrating method 300 for biasing a transistor connected to a voltage converter, according to an embodiment of the invention.

Method 300 starts by stage 310 of providing a test circuitry. Conveniently, the test circuitry includes at least one test circuit of a first type and at least one test circuit of a second type; whereas a parameter of the test circuit of the first type is representative of first leakage current of the transistor and wherein a parameter of the test circuit of the second type is representative of the second leakage current of the transistor.

According to an embodiment of the invention a relationship between an amount of test circuit of the first type and an amount of a test circuit of the second type is responsive to the at least one characteristic of the voltage converter.

Preferably, the characteristic of the voltage converter is a ratio between an input current of the voltage converter and an output current of the voltage converter.

Referring to the example set forth in FIG. 3, a test circuitry 100 is provided, having test circuits of a first and second type 101 and 105, whereas the ratio between the amount of the test circuits is responsive to Eff. Each test circuit has a leakage current that represents a leakage current of inverter 6 of FIG. 1.

Stage 310 is followed by stage 320 of measuring at least one parameter of a test circuitry representative of at least one characteristic of the transistor and of at least one characteristic of the voltage converter.

According to an embodiment of the invention the measured parameter is a leakage current. Conveniently, one of the transistor characteristics is responsive to the at least one characteristic of the voltage supply.

According to an embodiment of the invention, the at least one characteristic of the transistor is at least two leakage currents. Conveniently, a first leakage current is responsive to a characteristic of the voltage converter and wherein a second leakage current is substantially indifferent to the characteristic of the voltage converter.

Referring to the example set forth in FIG. 3 the test circuitry 100 includes test circuits that provide an indication about ILs/Eff and about ILsd.

According to an embodiment of the invention stage 320 includes measuring a discharge period of a capacitor being discharged by leakage currents of the test circuitry.

Stage 320 is followed by stage 330 of determining if a certain control criterion was fulfilled. The control criterion can be locating one or more optimal Vb.

If the answer is positive stage 330 is followed by stage 350 of providing a voltage bias to a well of the transistor in response to the measurements. If the answer is negative stage 330 is followed by stage 340 of altering at least one bias voltage and jumping to stage 320.

Figure 7:
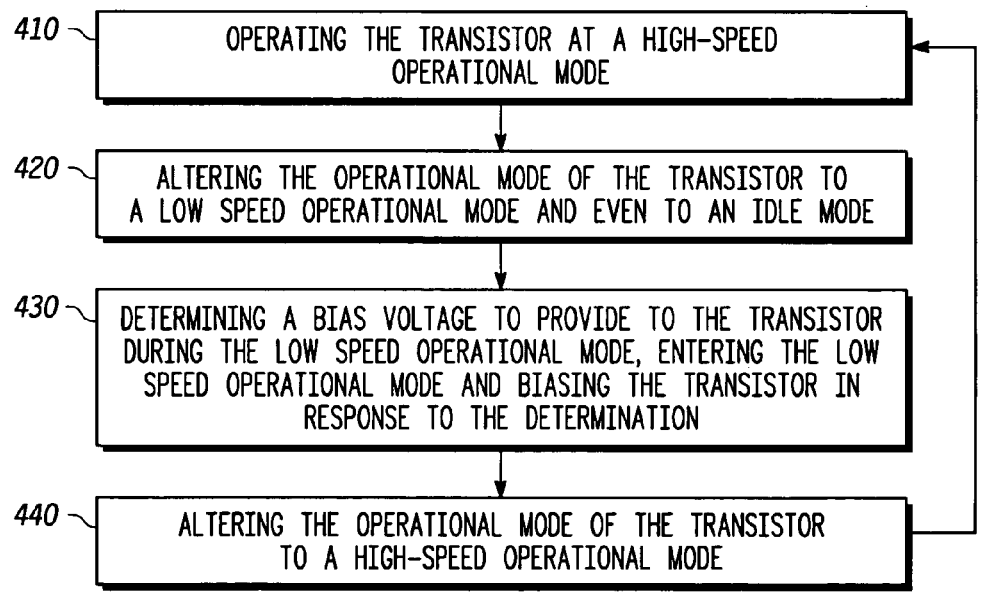
FIG. 7 is a flow chart illustrating an operating sequence of the transistor according to an embodiment of the invention.

FIG. 7 is a flow chart illustrating an operating sequence 400 of the transistor according to an embodiment of the invention.

Sequence 400 starts by stage 410 of operating the transistor at a high-speed operational mode. During this stage the transistor is operated at a high speed. Typically, the transistor is a part of a processor and the high-speed operation is required when the processor executed a high computational load task.

The control module 160 receives an indication relating to the operational mode of the transistor but according to another embodiment of the invention can control that operational mode and determine what said mode is without receiving another indication.

Typically, in this mode Vt has to be low, thus the voltage converter is disconnected from the well of the transistor. The well can receive bias voltages that do not exceed the power supplies Vdd and Vss.

Stage 410 is followed by stage 420 of altering the operational mode of the transistor to a low speed operational load and even to an idle mode.

Stage 420 is followed by stage 430 of determining a bias voltage to provide to the transistor during the low speed operational mode, entering the low speed operational load and biasing the transistor in response to the determination. Conveniently, stage 430 includes a sequence of stages such as stages 310–350. The voltage converter is activated to provide the required bias voltage.

Stage 430 is followed by altering the operational mode of the transistor and jumping to stage 410. As previously mentioned the voltage converter is usually disconnected from the transistor and a lower bias voltage is provided to the well of the transistor to allow faster operation.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for biasing a transistor coupled to a voltage converter, the method comprising:
    providing at least one bias voltage to at least one well of at least one transistor of a test circuitry;
    measuring at least one parameter of a test circuitry representative of at least one characteristic of the transistor and of at least one characteristic of the voltage converter;
    altering at least one bias voltage and repeating the stages of providing and measuring until a predefined control criteria is fulfilled; and
    and providing a voltage bias to a well of the transistor in response to the measurements;
    wherein the at least one characteristic of the transistor is at least two leakage currents;
    wherein a first leakage current is responsive to a characteristic of the voltage converter and wherein a second leakage current is substantially indifferent to the characteristic of the voltage converter.

2. The method of claim 1 wherein the at least one parameter is a leakage current.

3. The method of claim 1 whereas the control criterion is responsive to a leakage current level.

4. The method of claim 1 whereas one of the transistor characteristics is responsive to the at least one characteristic of the voltage supply.

5. The method of claim 1 further comprising a stage of providing a test circuitry that comprises at least one test circuit of a first type and at least one test circuit of a second type; whereas a parameter of the test circuit of the first type is representative of first leakage current and wherein a parameter of the test circuit of the second type is representative of the second leakage current.

6. The method of claim 5 wherein a relationship between an amount of test circuit of the first type and an amount of a test circuit of the second type is responsive to the at least one characteristic of the voltage converter.

7. The method of claim 6 wherein a characteristic of the voltage converter is a ratio between an input current of the voltage converter and an output current of the voltage converter.

8. The method of claim 1 further comprising selectively disconnecting the voltage converter from the transistor in response to an operational mode of the transistor.

9. The method of claim 8 wherein operational mode is characterized by an operating frequency of the transistor.

10. A device comprising:
    at least one transistor;
    at least one voltage converter, coupled to the at least one well of at least one transistor, for providing at least one bias voltage;
    a test circuitry, coupled to the at least one voltage converter, adapted to:
        (i) measure at least one parameter of the test circuitry representative of at least one characteristic of the transistor and of at least one characteristic of the voltage converter;
        (ii) alter at least one bias voltage provided to the test circuitry and measure at least one parameter, until a control criterion is fulfilled; and
        (iii) determine, in response to the at least one measured parameter, at least bias voltage to be provided to at least one well of the at least one transistor;
    wherein the at least one characteristic of the transistor is at least two leakage currents;
    wherein a first leakage current is responsive to a characteristic of the voltage converter and wherein a second leakage current is substantially indifferent to the characteristic of the voltage converter.

11. The device of claim 10 wherein a measured parameter is a leakage current.

12. The device of claim 10 whereas one of the transistor characteristics is responsive to the at least one characteristic of the voltage supply.

13. The device of claim 10 wherein the test circuitry comprises at least one test circuit of a first type and at least one test circuit of a second type; whereas a parameter of the test circuit of the first type is representative of first leakage current and wherein a parameter of the test circuit of the second type is representative of the second leakage current.

14. The device of claim 13 wherein a relationship between an amount of test circuit of the first type and an amount of a test circuit of the second type is responsive to the at least one characteristic of the voltage converter.

15. The device of claim 10 wherein a characteristic of the voltage converter is a ratio between an input current of the voltage converter and an output current of the voltage converter.

16. The device of claim 10 further adapted to selectively disconnect the voltage converter from the transistor in response to an operational mode of the transistor.

17. The device of claim 16 wherein the operational mode is characterized by an operating frequency of the transistor.

* * * * *